US012415367B2

(12) United States Patent
Lyman et al.

(10) Patent No.: US 12,415,367 B2
(45) Date of Patent: Sep. 16, 2025

(54) MULTI-ANTENNA MOBILE PRINTERS

(71) Applicant: ZEBRA TECHNOLOGIES CORPORATION, Lincolnshire, IL (US)

(72) Inventors: Roy P. Lyman, Coventry, RI (US); Stephen A. Carello, Johnston, RI (US); Francis Joseph Calabresi, Harvard, MA (US)

(73) Assignee: Zebra Technologies Corporation, Lincolnshire, IL (US)

( * ) Notice: Subject to any disclaimer, the term of this patent is extended or adjusted under 35 U.S.C. 154(b) by 224 days.

(21) Appl. No.: 18/231,699

(22) Filed: Aug. 8, 2023

(65) Prior Publication Data

US 2025/0050658 A1 Feb. 13, 2025

(51) Int. Cl.
| | |
|---|---|
| *B41J 3/36* | (2006.01) |
| *B41J 3/38* | (2006.01) |
| *B41J 29/02* | (2006.01) |
| *B41J 29/393* | (2006.01) |
| *H01Q 1/12* | (2006.01) |
| *H01Q 1/22* | (2006.01) |
| *H01Q 23/00* | (2006.01) |
| *H05K 5/00* | (2006.01) |

(52) U.S. Cl.
CPC . *B41J 3/36* (2013.01); *B41J 3/38* (2013.01); *B41J 29/02* (2013.01); *B41J 29/393* (2013.01); *H01Q 1/125* (2013.01); *H01Q 1/2258* (2013.01); *H01Q 1/2291* (2013.01); *H01Q 23/00* (2013.01); *H05K 5/0018* (2022.08); *B41J 2029/3932* (2013.01)

(58) Field of Classification Search
CPC ....... B41J 3/36; B41J 3/38; B41J 29/02; B41J 29/393; B41J 2029/3932; B41J 3/4075; B41J 2029/3937; H01Q 1/125; H01Q 1/2258; H01Q 1/2291; H01Q 23/00; H05K 5/0018
See application file for complete search history.

(56) References Cited

U.S. PATENT DOCUMENTS

| | | | |
|---|---|---|---|
| 2022/0063296 A1* | 3/2022 | Chen | G06K 15/021 |
| 2022/0223997 A1* | 7/2022 | Botsai | H01Q 1/38 |

FOREIGN PATENT DOCUMENTS

| | | | | |
|---|---|---|---|---|
| CN | 109687150 A | * | 4/2019 | H01Q 1/2258 |

OTHER PUBLICATIONS

English Translation CN-109687150-A (Year: 2019).*

* cited by examiner

*Primary Examiner* — Douglas X Rodriguez
*Assistant Examiner* — Tracey M McMillion

(57) ABSTRACT

A printer includes: a housing with walls enclosing a compartment, and defining an adjacent media supply chamber; a cover coupled to an end of the housing beside the media supply chamber, movable between open and closed positions to expose or enclose the media supply chamber; a print head to apply indicia to media from the media supply chamber, and cooperate with the cover to form an outlet at a front wall of the housing for dispensing the media; a frame within the compartment, defining a first mounting surface beside and oriented towards a second end of the housing, a second mounting surface with a portion orthogonal to the first mounting surface and oriented towards a side of the housing, and a third mounting surface oriented towards the front wall; and first, second, and third antennas disposed on the first, second, and third mounting surfaces respectively.

15 Claims, 10 Drawing Sheets

MULTI-ANTENNA MOBILE PRINTERS

BACKGROUND

Media processing devices, such as mobile printers, may communicate using more than one communications standard and/or frequency. Providing components within a media processing device to implement multiple communications standards and/or frequencies may be complicated by limited physical space in which to place the various components of the device and by potential radiofrequency interference caused by the various components.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
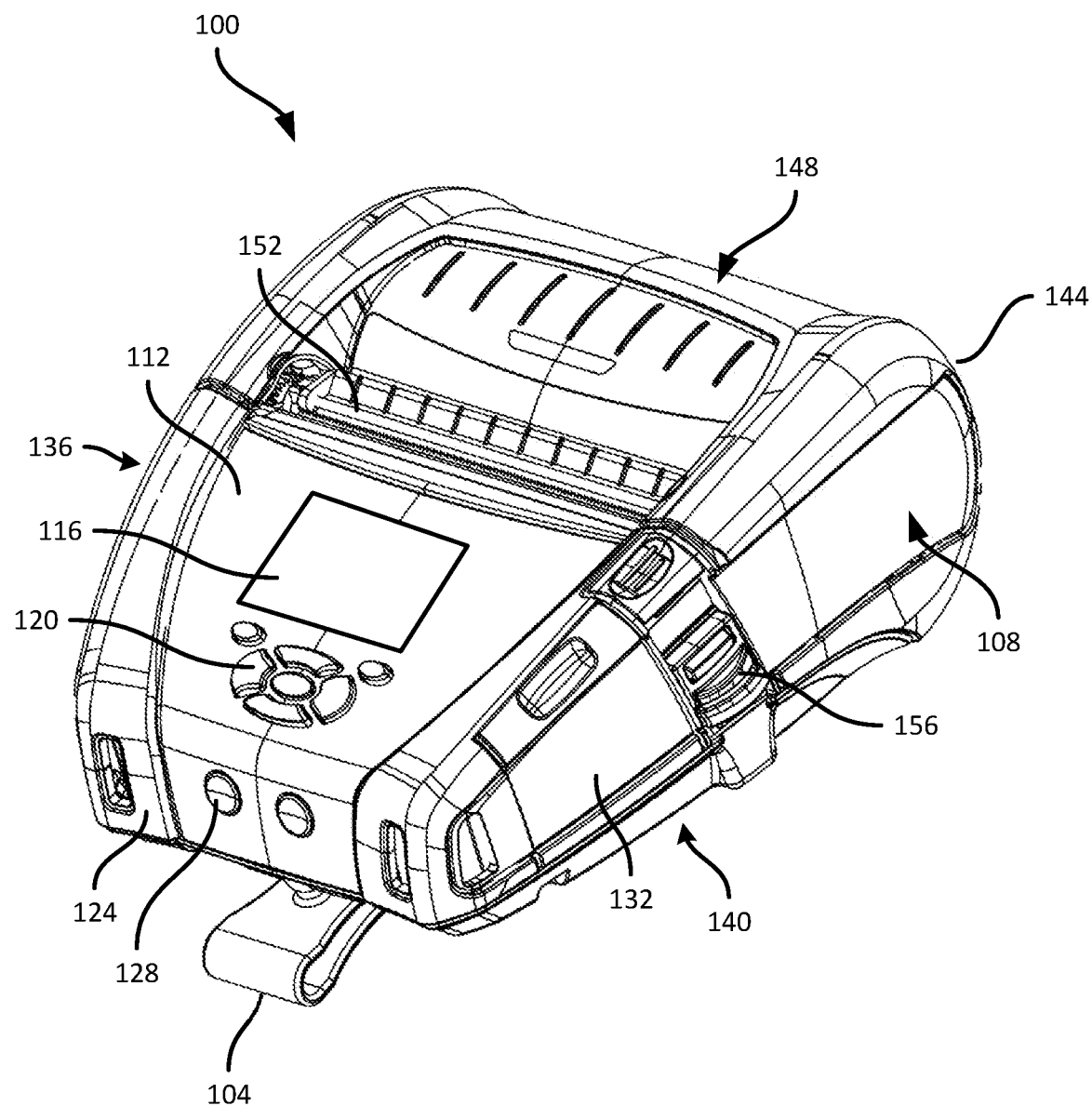
FIG. 1 is a top perspective view of a media processing device.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Examples disclosed herein are directed to a media processing device, comprising: a housing having a plurality of walls enclosing a compartment, and defining a media supply chamber adjacent to the compartment; a cover movably coupled to a first end of the housing adjacent to the media supply chamber, the cover movable between a closed position to enclose the media supply chamber, and an open position to expose the media supply chamber; a print head configured to (i) apply indicia to media from the media supply chamber, and (ii) cooperate with the cover to form an outlet at a front wall of the housing for dispensing the media; a frame supported by the housing within the compartment, the frame defining (i) a first mounting surface adjacent to a second end of the housing opposite the first end, the first mounting surface oriented towards the second end, (ii) a second mounting surface, a portion of the second mounting surface orthogonal to the first mounting surface and oriented towards a side of the housing, and (iii) a third mounting surface oriented towards the front wall of the housing; a first antenna disposed on the first mounting surface; a second antenna disposed on the second mounting surface, controllable with the first antenna to implement a first communications standard; and a third antenna disposed on the third mounting surface, and controllable to implement a second communications standard.

Additional examples disclosed herein are directed to a media processing device, comprising: a housing having a plurality of walls enclosing a compartment, and defining a media supply chamber adjacent to the compartment; a cover movably coupled to a first end of the housing adjacent to the media supply chamber, the cover movable between a closed position to enclose the media supply chamber, and an open position to expose the media supply chamber; a print head configured to (i) apply indicia to media from the media supply chamber, and (ii) cooperate with the cover to form an outlet at a front wall of the housing opposite the back wall, for dispensing the media; a frame supported by the housing within the compartment, the frame defining a first mounting surface adjacent to a second end of the housing opposite the first end, the first mounting surface oriented towards the second end; a plurality of secondary walls defining a battery well extending into the compartment from a back wall of the housing, the secondary walls defining (i) a second mounting surface within the compartment, orthogonal to the first mounting surface and oriented towards a side of the housing, and (ii) a third mounting surface within the compartment having a portion oriented towards the side of the housing; a first antenna disposed on the first mounting surface; a second antenna disposed on the second mounting surface, controllable with the first antenna to implement a first communications standard; and a third antenna disposed on the third mounting surface, and controllable to implement a second communications standard.

Further examples disclosed herein are directed to a media processing device, comprising: a housing having a plurality of walls enclosing a compartment, and defining a media supply chamber adjacent to the compartment; a first side wall of the housing having an inner surface within the compartment defining a first mounting surface; a first antenna disposed on the first mounting surface of the side wall, the first antenna controllable to implement a first communications standard; a cover movably coupled to a first end of the housing adjacent to the media supply chamber, the cover movable between a closed position to enclose the media supply chamber, and an open position to expose the media supply chamber; a print head configured to (i) apply indicia to media from the media supply chamber, and (ii) cooperate with the cover to form an outlet at a front wall of the housing opposite the back wall, for dispensing the media; a frame supported by the housing within the compartment, the frame defining a second mounting surface adjacent to a second end of the housing opposite the first end, the second mounting surface oriented towards the second end; a second antenna disposed on the second mounting surface; an internal wall disposed within the compartment, the internal wall defining a third mounting surface adjacent to a second side wall of the housing, opposite the first side wall, and facing towards the second side wall; and a third antenna disposed on the third mounting surface, controllable with the second antenna to implement a second communications standard.

FIG. 1 illustrates a media processing device 100, such as a label printer (also referred to herein simply as the printer 100). The printer 100 can be implemented as a battery-powered mobile label printer, as illustrated. For example, the printer 100 can be worn or otherwise carried by an operator via a mounting accessory 104, such as a belt clip (as illustrated in FIG. 1), a carrying strap, or the like, coupled to a housing 108 of the printer 100. The printer 100 can also be implemented in a wide variety of other form factors, including a desktop printer or the like.

The printer 100 includes various components configured to apply indicia to media such as discrete labels, a continuous paper strip, identity cards, or the like. In the illustrated example, the printer 100 applies indicia via direct thermal printing, in which a print head applies heat to portions of the media, such as thermally-sensitive paper or other media, to activate a thermochromic coating of the media and generate indicia thereon. In other examples, the printer 100 can implement thermal transfer printing, or the like. In some examples, the media processing device 100 can include a radio frequency identification (RFID) assembly configured to write data to RFID tags embedded in labels or other media, in addition to or instead of applying indicia to the media.

The printer 100 includes the above-mentioned housing 108, which includes a plurality of walls. The walls of the housing 108 include, in this example, a front wall 112, e.g. configured to face outwards from an operator when the printer 100 is worn or otherwise carried by the operator. The front wall 112 can include an opening in which a display 116 is disposed, and can also support control elements such as buttons 120, e.g., for navigating menus or other information presented on the display 116.

The walls of the housing 108 can also include an end wall 124, defining one end of the printer 100 (e.g., the end facing upwards when the printer 100 is worn or otherwise carried by an operator). The end wall 124 can support additional control elements, such as buttons 128 (e.g., a power button and a feed button, although a wide variety of other controls can be implemented by the buttons 128). The walls of the housing 108 further include side walls 132 and 136, extending between the front wall 112 and an opposing back wall, as well as between the end wall 124 and an opposing end 144 of the printer 100.

The printer 100 further includes a cover 148 movably coupled to the housing 108 at the end 144. The cover 148, as discussed below, is movable between a closed position, illustrated in FIG. 1, and an open position that exposes certain internal portions of the printer 100. The cover 148 also supports a platen roller that cooperates with a print head supported by the housing 108, adjacent to a portion of the front wall 112, to form an outlet 152 for dispensing media processed via the print head. The cover 148 can be unlatched or otherwise released to move relative to the housing 108 via one or more actuators such as a latch 156.

Figure 2:
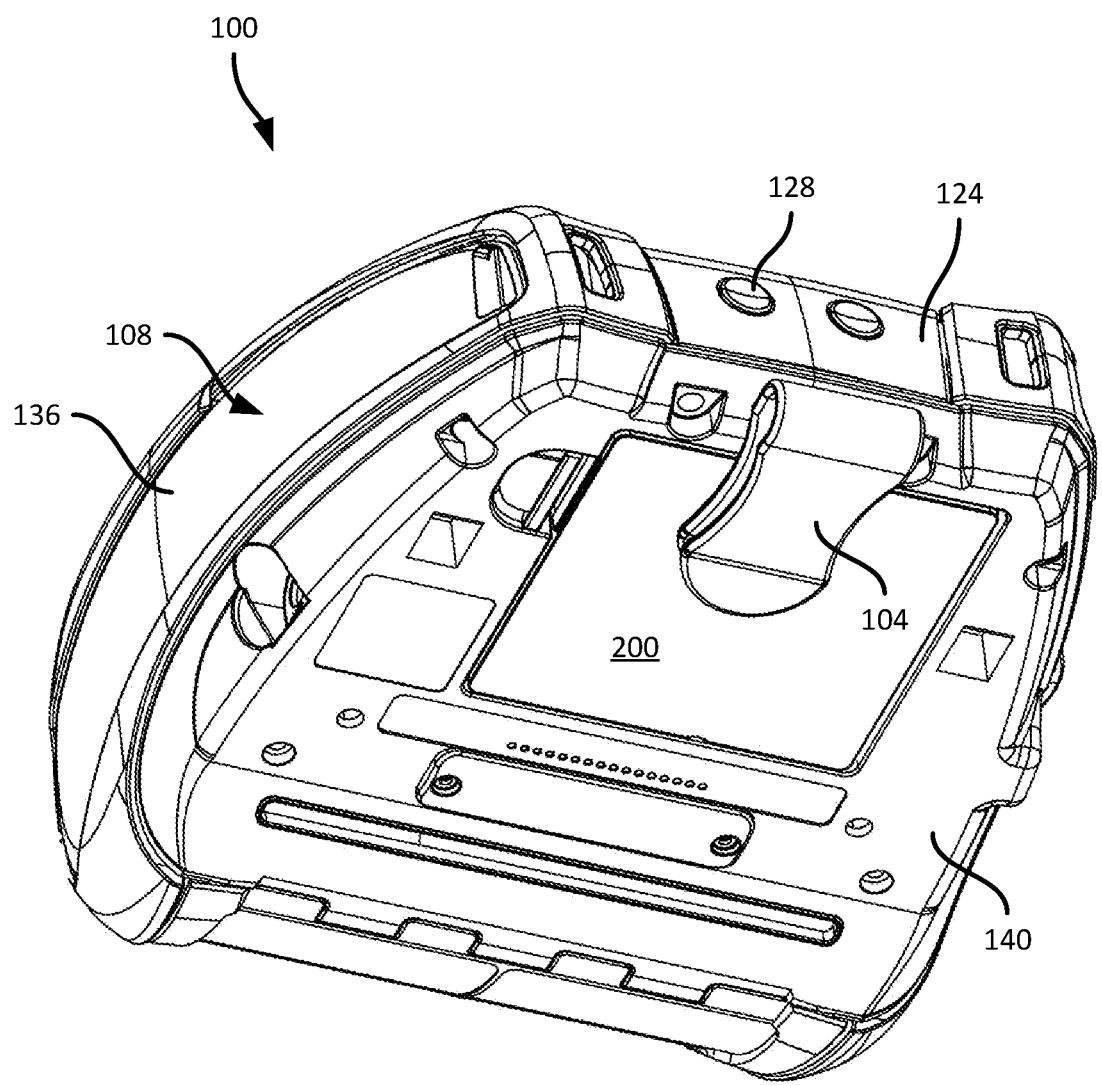
FIG. 2 is bottom perspective view of the media processing device of FIG. 1.

Turning to FIG. 2, the printer 100 is shown from the opposite side as in FIG. 1, revealing the other side wall 136 and the back wall 140. The housing 108 also defines a battery well extending into the back wall 140, in which a battery pack 200 (e.g., a rechargeable battery) can be removably inserted. In the present example, removal or insertion of the battery pack 200 may also involve moving or removing the mounting accessory 104 from the housing 108.

The printer 100 can transmit and receive data, such as data defining indicia to be applied to media, as well as a wide variety of other information (e.g., firmware updates, usage statistics, and the like), by wireless communications with other computing devices. To that end, the printer 100 may support two or more wireless communications standards. For example, the printer 100 can support a personal area network (PAN) standard, such as Bluetooth™ (e.g., Bluetooth 5.2, although more recent and/or older versions may also be supported), Bluetooth Low Energy, and the like. The printer 100 can also support a wireless local area network (WLAN) standard, such as one or more members of the Institute of Electrical and Electronics Engineers (IEEE) 802.11 family of standards (e.g., 802.11 ax, also referred to as Wi-Fi 6 or Wi-Fi 6E; various other 802.11 WLAN standards may also be supported). The printer 100 therefore includes various hardware components for supporting the above communications standards. In some examples, the printer 100 includes a first antenna for PAN communications, and two additional antennas for WLAN communications, e.g., to support 2×2 multiple-input and multiple-output (MIMO) WLAN communications.

The above-mentioned antennas may be susceptible to interference from other internal components of the printer 100, as well as from each other. Further, optimal performance of the antennas may involve, for example, placing the two WLAN antennas at substantially orthogonal orientations to one another. In order to accommodate the antennas in the limited physical space available within the printer 100, while mitigating either or both of performance impacts on the antennas by other components within the printer 100, and increased assembly complexity, the printer 100 defines various mounting surfaces for the antennas, as described below.

Figure 3:
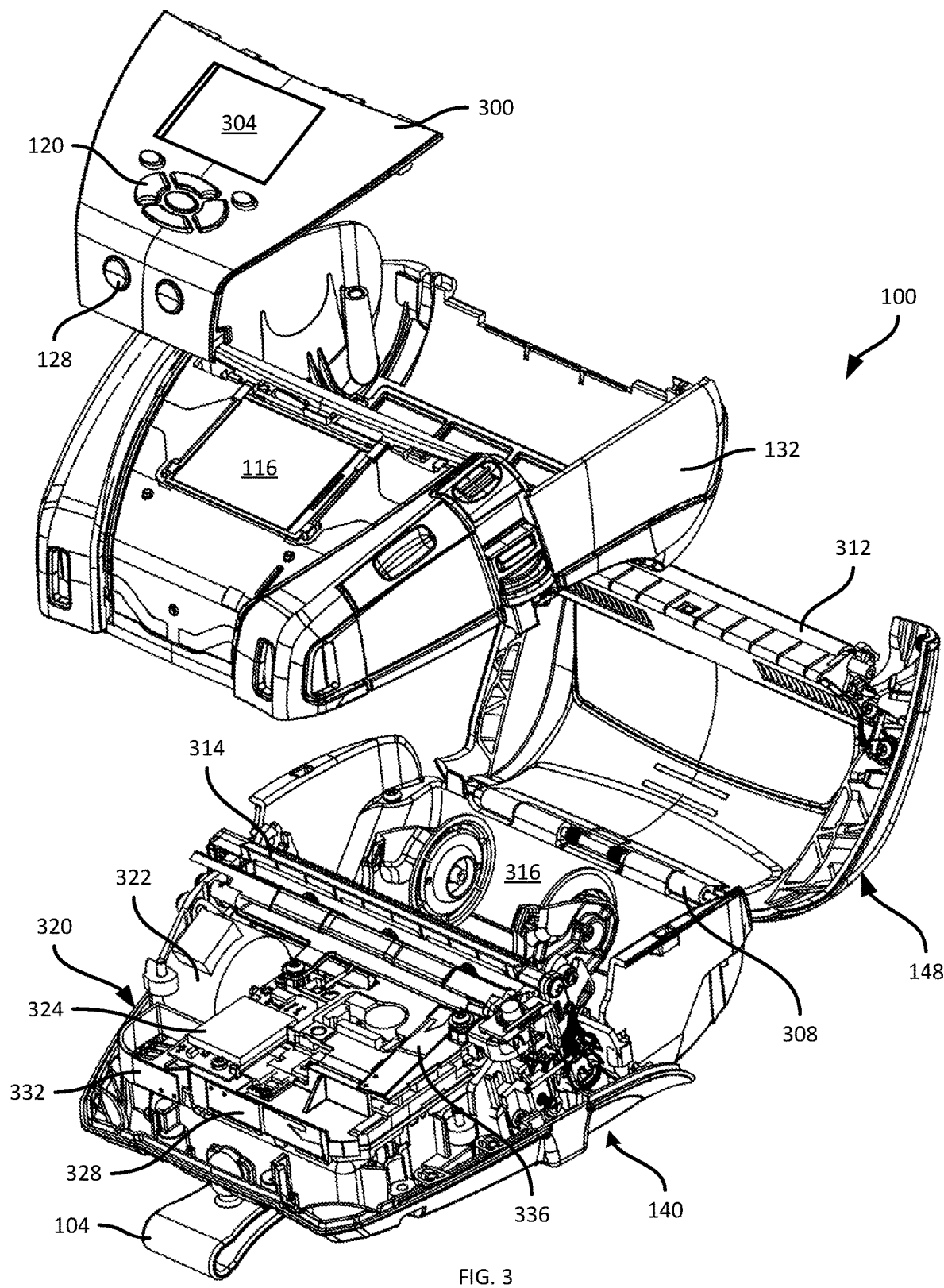
FIG. 3 is an exploded view of the media processing device of FIG. 1.

Turning to FIG. 3, a partially exploded view of the printer 100 is shown, in which a portion of the housing 108 defining the side walls 132 and 136, as well as the front wall 112, is separated from another portion of the housing 108 defining the back wall 140. A portion 300 of the front wall 112 is shown separate from the remainder of the front wall 112, illustrating an opening 304 for the display 116.

The cover 148 is illustrated in the open position in FIG. 3, e.g., having rotated relative to the housing 108 about an axis 308. As mentioned earlier, the cover 148 includes a platen roller 312, and the housing 108 supports a print head 314, e.g., a thermal print head. The platen roller 312 is configured to draw media from a media supply chamber 316 defined by the housing 108. The media supply chamber 316 can support, for example, a roll of paper or other media that is fed to the print head 314 for application of indicia and dispensing via the outlet 152. The cover 148 exposes the media supply chamber 316 in the open position as shown in FIG. 3, e.g., for installation of a media supply, and encloses the media supply chamber 316 in the closed position, as shown in FIG. 1.

The housing 108 also defines a compartment 320 adjacent to the media supply chamber 316, and enclosed within the housing 108. The compartment 320 contains a variety of other components of the printer 100, including for example a controller 324 and associated circuits, chips, and the like, for controlling the operation of the printer 100, communicating with other computing devices, and the like. The compartment 320 further contains the print head 314, and can also include a drive assembly including a motor 322 configured to drive the platen roller 312, e.g., via a gear train supported at least partly within the compartment 320 (portions of the gear train may extend into the media supply chamber 316).

The compartment 320 also contains the above-mentioned antennas, including a first antenna 328, a second antenna 332, and a third antenna 336 such that the antennas 328, 332, and 336 are included within the housing 108 and radiofrequency signals radiate through the housing 108 to and from the antennas 328, 332, and 336. In this example, the first and second antennas 328 and 332 can implement a first communications standard, such as a WLAN standard. The first and second antennas 328 and 332 can be controlled together, for example, for 2×2 MIMO communications. The third antenna 336 can implement a second communications standard, such as a PAN standard. As discussed below, the antennas 328, 332, and 336 are disposed on mounting surfaces defined within the compartment 320 to place radiative portions of the antennas 328 and 332 in substantially orthogonal orientations relative to one another, as well as to mitigate interference between antennas, and mechanical and/or radiofrequency interference with antenna performance by other components of the printer 100. The antennas 328, 332, and 336 can be implemented as patch antennas, although the antennas 328, 332, and 336 can be implemented using different types of antennas.

Figure 4:
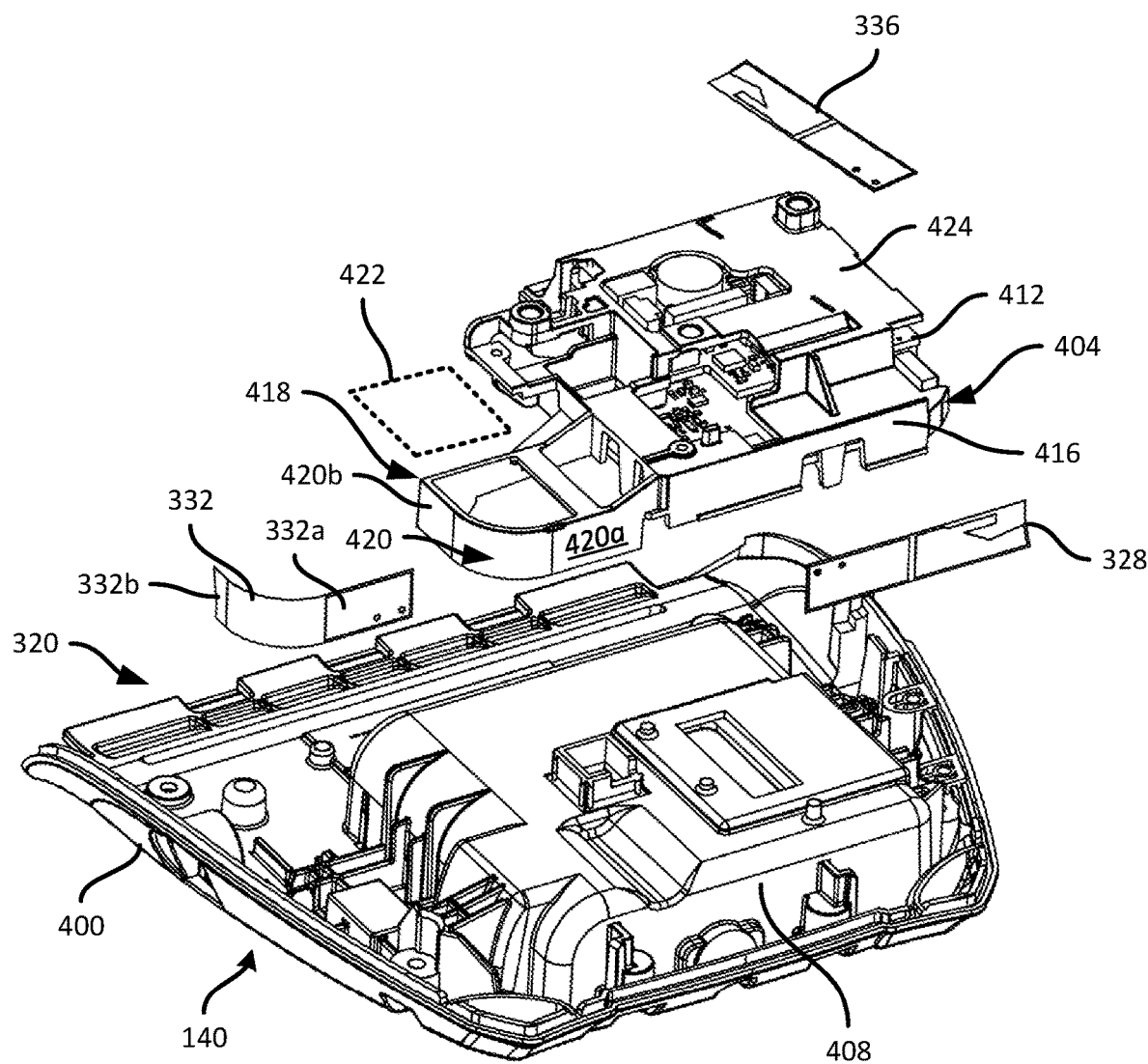
FIG. 4. is a diagram of a portion of the interior of the media processing device of FIG. 1.

Turning to FIG. 4, a portion of the housing 108 is shown in isolation. In particular, a wall 400 of the housing 108, defining part of the back wall 140, is illustrated. As shown in FIG. 4, the printer 100 includes a frame 404 disposed within the compartment 320, e.g., resting on or otherwise coupled to the wall 400. In this example, the housing 108 includes a set of secondary walls defining a battery well 408, as noted earlier. The secondary walls extend into the compartment 320 from the wall 400 (e.g., from the back wall 140), defining a cavity outside the compartment 320 into which the battery pack 200 can be inserted. In this example, the frame 404 is supported within the compartment 320 on at least one of the walls of the battery well 408.

The frame 404 supports various components of the printer 100, and some or all of those components, including the antennas 328, 332, and 336, can be assembled with the frame 404 prior to installation of the frame 404 into or onto the housing 108 (e.g., by fastening the frame 404 to the battery well 408). Assembly of the printer 100 may therefore be simplified, e.g., in comparison to an embodiment in which one or more of the antennas 328, 332, and 336 are installed on portions of the housing 108, or on movable parts such as the cover 148.

The components supported by the frame 404 can include one or more printed circuit boards 412 carrying the controller 324 (not shown in FIG. 4) and other electronic elements of the printer 100. The frame 404 also defines, in this example, mounting surfaces for the antennas 328, 332, and 336. In particular, the frame 404 defines a first mounting surface 416 upon which the antenna 328 is disposed. The first mounting surface 416 is adjacent to the end wall 124 (e.g., the opposite end from the end at which the cover 148 is mounted to the housing 108), and is oriented towards the end wall 124. That is, the mounting surface 416 faces outwards from the compartment 320 towards the exterior of the printer 100. The antenna 328, in turn, is configured to radiate in the direction in which the mounting surface 416 faces. The antenna 328 is therefore placed closer to the end wall 124 than to the media supply chamber 316, the platen roller 312, and the print head 314. The antenna 328 can be separated from the media supply chamber 316, the platen roller 312, and the print head 314 by the frame 404 and the other components thereon, in other words. Further, the antenna 328 radiates through the end wall 124, rather than through the circuit board 412 and other components between the mounting surface 416 and the end 144 of the printer 100. That is, the antenna 328 radiates substantially away from the platen roller 312, the print head 314, and the media supply chamber 316. As seen from FIGS. 3 and 4, the first mounting surface 416 can face towards the buttons 128. Although the antenna 328 therefore radiates through the buttons 128, the buttons 128 contain little conductive material and therefore are not expected to interfere significantly with the antenna 328.

The frame 404 also includes a projection 418 that defines a second mounting surface 420, on which the second antenna 332 is disposed. The projection 418 places the mounting surface 420 adjacent to the side wall 136, and defines, with a remainder of the frame, a space 422 that accommodates the motor 322 seen in FIG. 3. The mounting surface 420 wraps around a corner of the frame 404, and thus includes a portion 420a that is oriented towards the end wall 124 (and is substantially coplanar with the mounting surface 416), and another portion 420b that is oriented towards the side wall 136, substantially orthogonal to the mounting surface 416. The antenna 332, in turn, includes a feed segment or portion 332a, configured to be disposed on the portion 420a of the mounting surface 420, and a radiative portion 420b configured to be disposed on the portion 420b of the mounting surface 420. More generally, each of the antennas 328, 332, and 336 includes a feed portion and a radiative portion. The feed segment 332a includes ports (e.g., a transmission port and a reception port) for connection to the controller 324 or another suitable component, while the radiative segment 332b is configured to radiate, e.g., towards the side wall 136 rather than towards the side wall 132 (and through other components such as the controller 324, circuit board 412, and the like). The antenna 332, in other words, is positioned to radiate in a direction substantially orthogonal to the radiative direction of the antenna 328. The antenna 332 is further positioned so as to be separated from the media supply chamber 316, the platen roller 312, and the print head 314 by either or both of the motor 322 and the frame 404. As seen in FIG. 3, the antenna 332 is also separated from the media supply chamber 316 and the platen roller 312 by the print head 314, and radiates substantially away from each of the platen roller 312, the print head 314, and the media supply chamber 316.

The frame 404 further defines a third mounting surface 424, on which the antenna 336 is disposed. The mounting surface 424 is oriented towards the front wall 112 of the housing 108, and therefore away from the battery well 408. As seen in FIG. 4, the mounting surface 424 is on an upper portion of the frame 404, placing the circuit board 412 in between the mounting surface 424 and the battery well 408. The antenna 336 is configured to radiate towards the front wall 112, and away from the circuit board 412 and battery well. Placement of the antenna 336 on the mounting surface 424 thus mitigates interference with performance of the antenna 336 by the circuit board 412, the battery pack 200, and the like. Placement of the antenna 336 on the mounting surface 424 also distances the antenna 336 sufficiently from the antennas 328 and 332 to mitigate interference between the antenna 336 and the other antennas. Further, as seen from FIGS. 3 and 4, the mounting surface 424 is adjacent to the side wall 132, and specifically is closer to the side 132 than the display panel 116. The antenna 336 can therefore radiate through the front wall 112 and not through the display 116, avoiding or at least reducing interference that could result from radiating through the display 116. As seen in FIG. 3 and FIG. 4, the antenna 336 is closer to the media supply chamber 316, and to the print head 314 (and the platen roller 312, when the cover 148 is closed) than the antennas 328 and 332. However, the antenna 336 remains separated from the platen roller 312 and the media supply chamber 316 by the print head 314, and radiates substantially away from each of the platen roller 312, the print head 314, and the media supply chamber 316.

Figure 5:
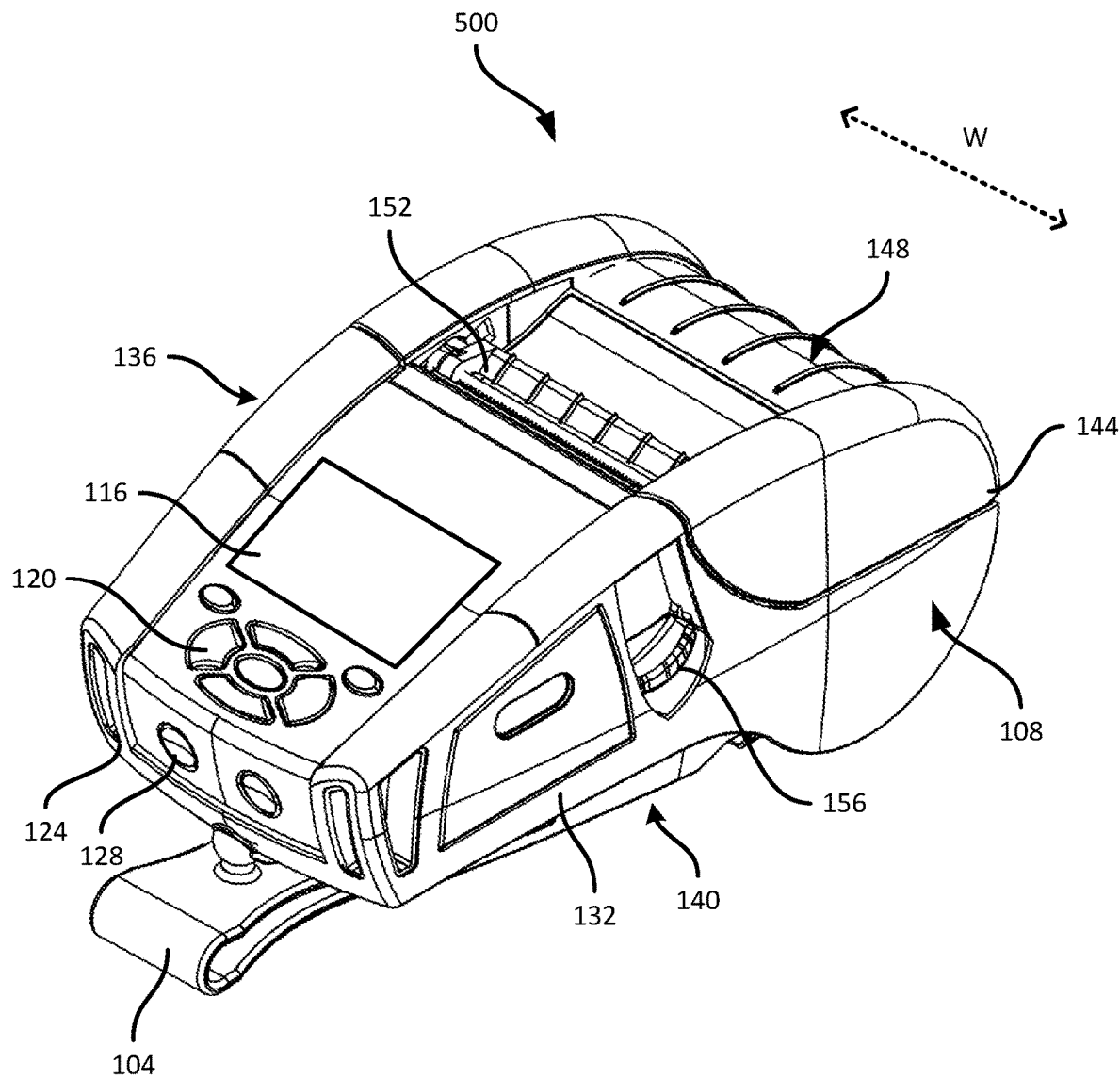
FIG. 5 is another perspective view of a media processing device.

Turning to FIG. 5, a printer 500 is shown according to another embodiment. In the discussion below, like numbers to those discussed above refer to components that are not necessarily identical, but are functionally similar to those discussed above. Certain features of those components, such as physical dimensions, shapes, and positions, may vary in the printer 500 relative to the printer 100, as shown in the drawings and discussed below.

As seen in FIG. 5, a width W of the printer 500 (e.g., the distance between the side walls 132 and 136) may be reduced in comparison to the printer 100 shown in FIGS. 1-4. The interior of the printer 500 may therefore have a smaller volume. As discussed below, the printer 500 provides mounting surfaces for the antennas 328, 332, and 336 that are positioned differently than those of the printer 100.

Figure 6:
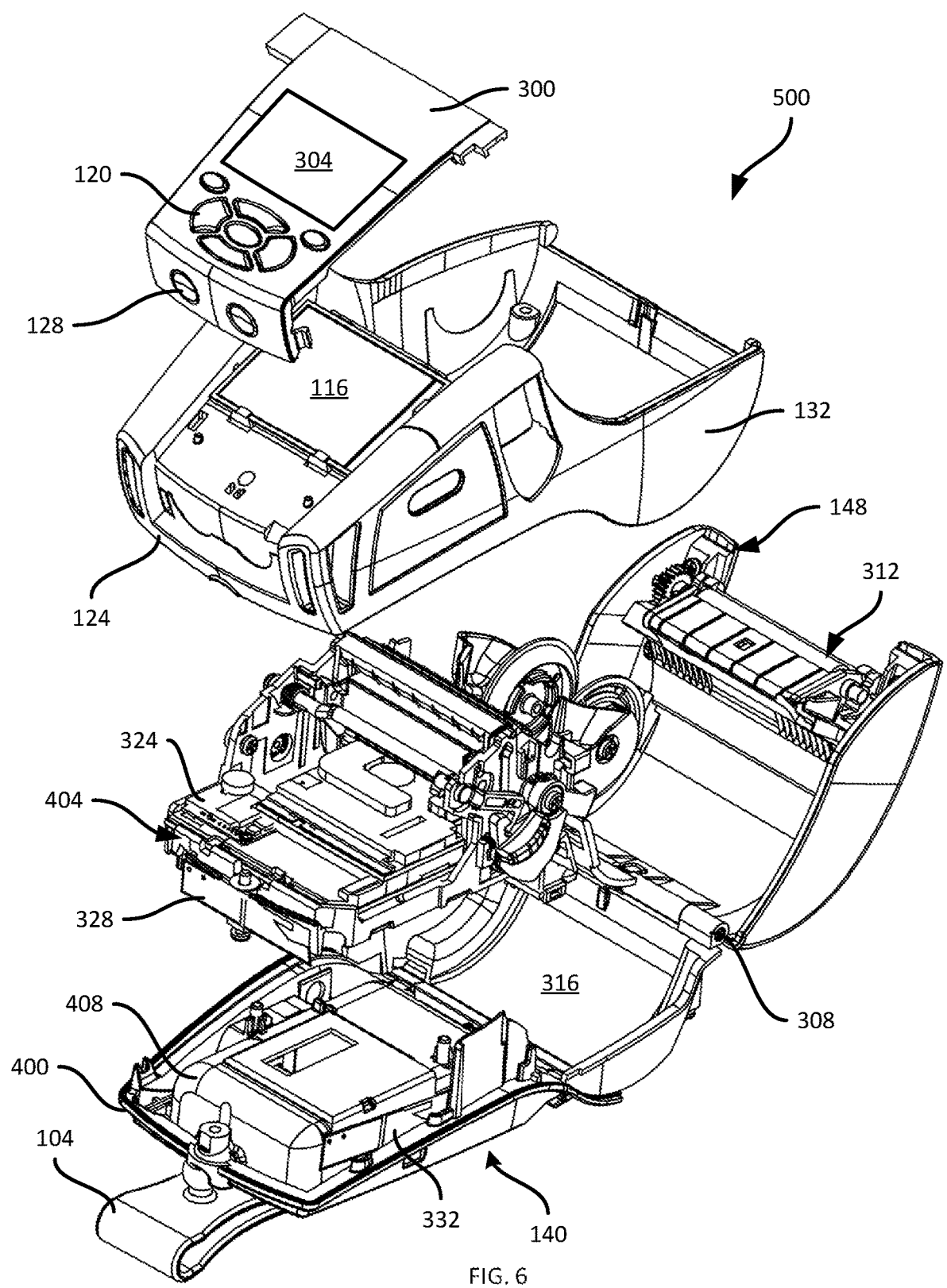
FIG. 6 is an exploded view of the media processing device of FIG. 5.

Turning to FIG. 6, an exploded view of the printer 500, in which the frame 404 is shown removed from the wall 400 (which, as noted in connection with FIG. 4, defines a portion of the back wall 140), and the side walls 132 and 136, as well as the front wall 112 are removed from the remainder of the housing 108. As seen in FIG. 6, the reduced width of the printer 500 compared to the printer 100 results in the display 116 occupying a larger fraction of the width of the printer 500. As a result, placing the antenna 336 on an upper surface of the frame 404 as shown in FIG. 4 may result in the antenna 336 being located underneath the display 116, rather than underneath a portion of the front wall 112 beside the display 116. As discussed below, the antenna 336, which is not visible in FIG. 6, is installed in a location distinct from the frame 404. Further, for example as a result of the reduced size of the frame 404 and/or the reduced volume for accommodating other components of the printer (e.g., gear trains, motors, and the like), the antenna 332 is also installed on a mounting surface distinct from the frame 404. The antenna 328 remains mounted on the frame 404.

Figure 7:
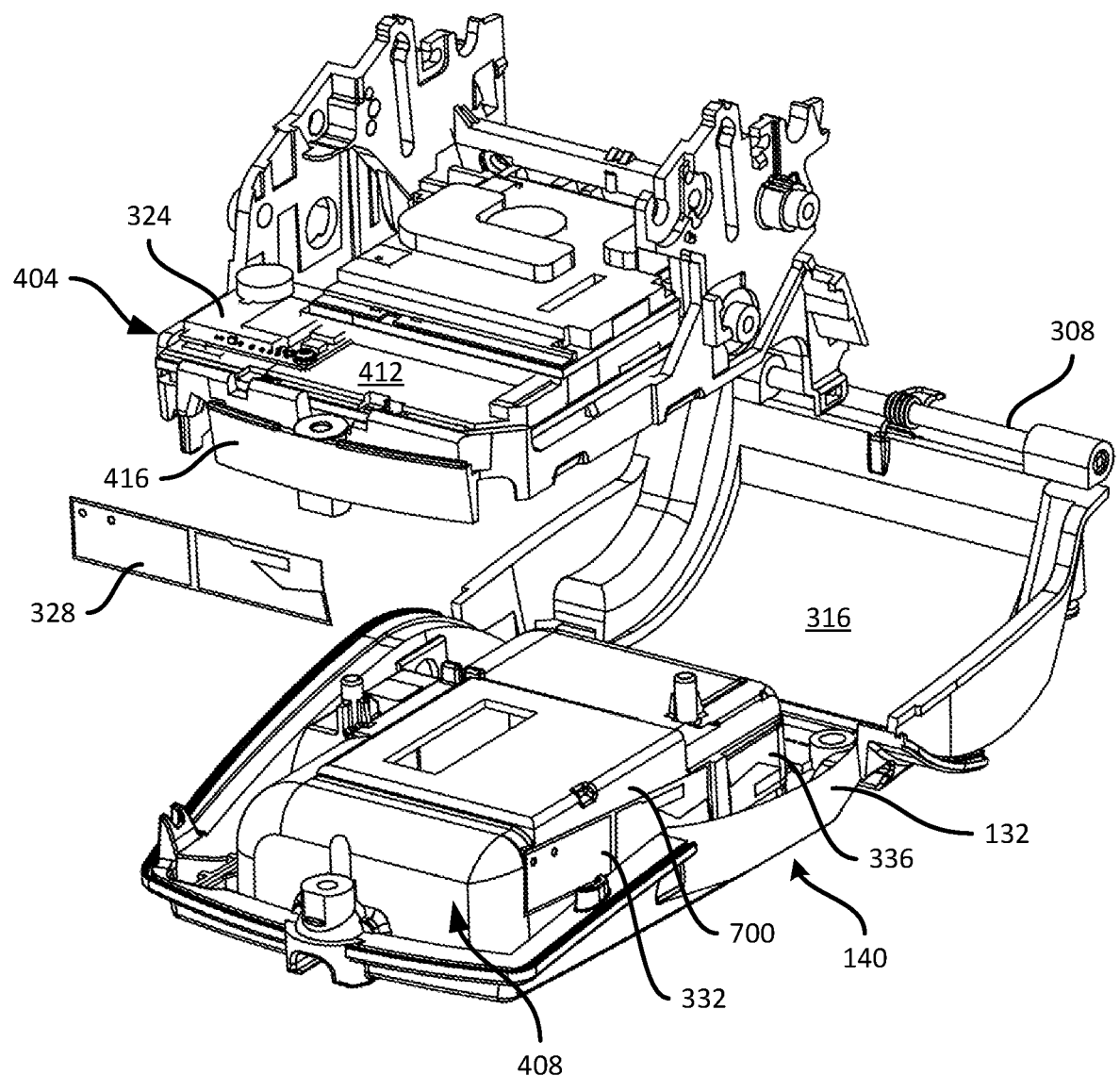
FIG. 7 is an exploded view of a portion of the interior of the media processing device of FIG. 5.

Referring to FIG. 7, the frame 404 and the back wall 140 are shown in isolation from the remainder of the housing 108. As seen in FIG. 7, the first mounting surface 416, as described earlier in connection with FIG. 4, is oriented towards the end wall 124, away from the media supply chamber 316. The antenna 328 can therefore radiate through the end wall 124 and the buttons 128. As also seen in FIG. 7, the antenna 332 and the antenna 336 are disposed on internal walls, located within the compartment 320. In this example, mounting surfaces for the antennas 332 and 336 are defined by the battery well 408. In particular, the antenna 332 and the antenna 336 are disposed on a side wall 700 of the battery well 408, oriented towards the side wall 132, such that the antennas 332 and 336 radiate away from the battery well, through the side wall 132.

Figure 8:
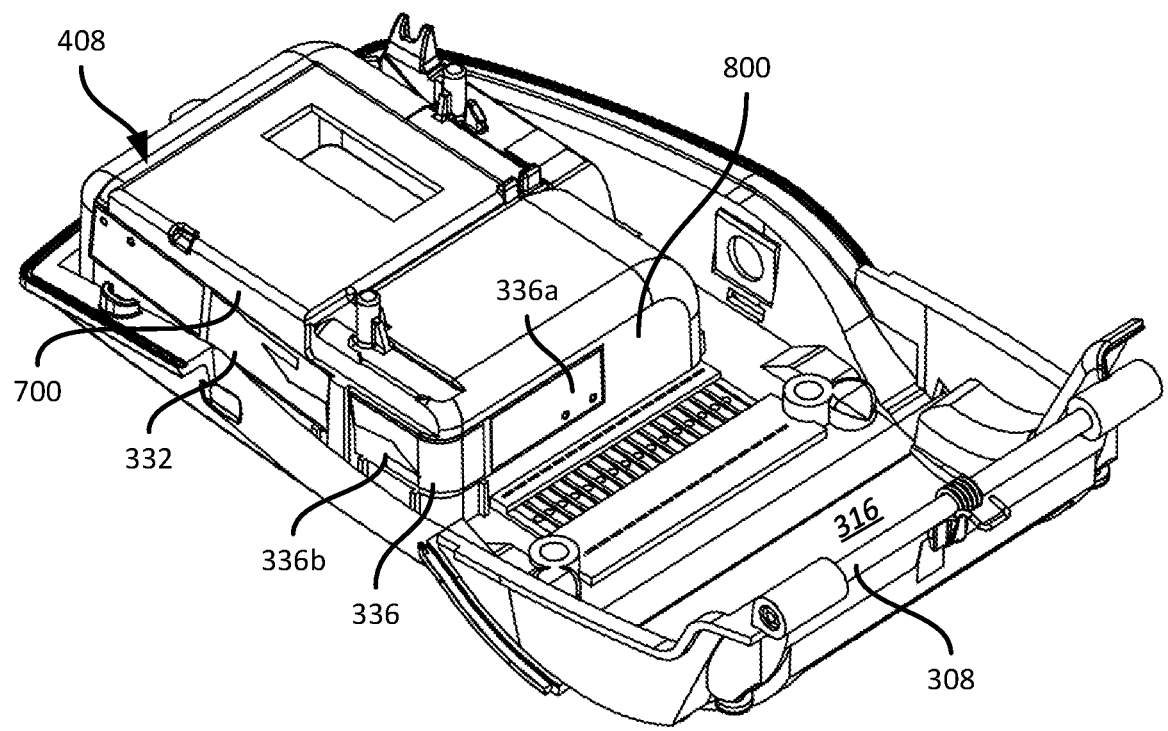
FIG. 8 is a perspective view of a back portion of a further media processing device in isolation.

As shown in FIG. 8, while the second mounting surface for the antenna 332 is located entirely on the side wall 700 of the secondary walls defining the battery well 408, the third mounting surface for the antenna 336 wraps from the side wall 700 to an end wall 800, facing the media supply chamber 316. The antenna 336 includes a feed segment 336a (that is, a non-radiating segment) on the end wall 800, and a radiating segment 336b on the side wall 700. As such, the radiating segment 336b can be oriented such that the radiating segment 336b faces the media supply chamber 316 and the radiating segment may receive and/or transmit radiofrequency waves through the media supply chamber 316 as well as any media contained within the media supply chamber 316.

Figure 9:
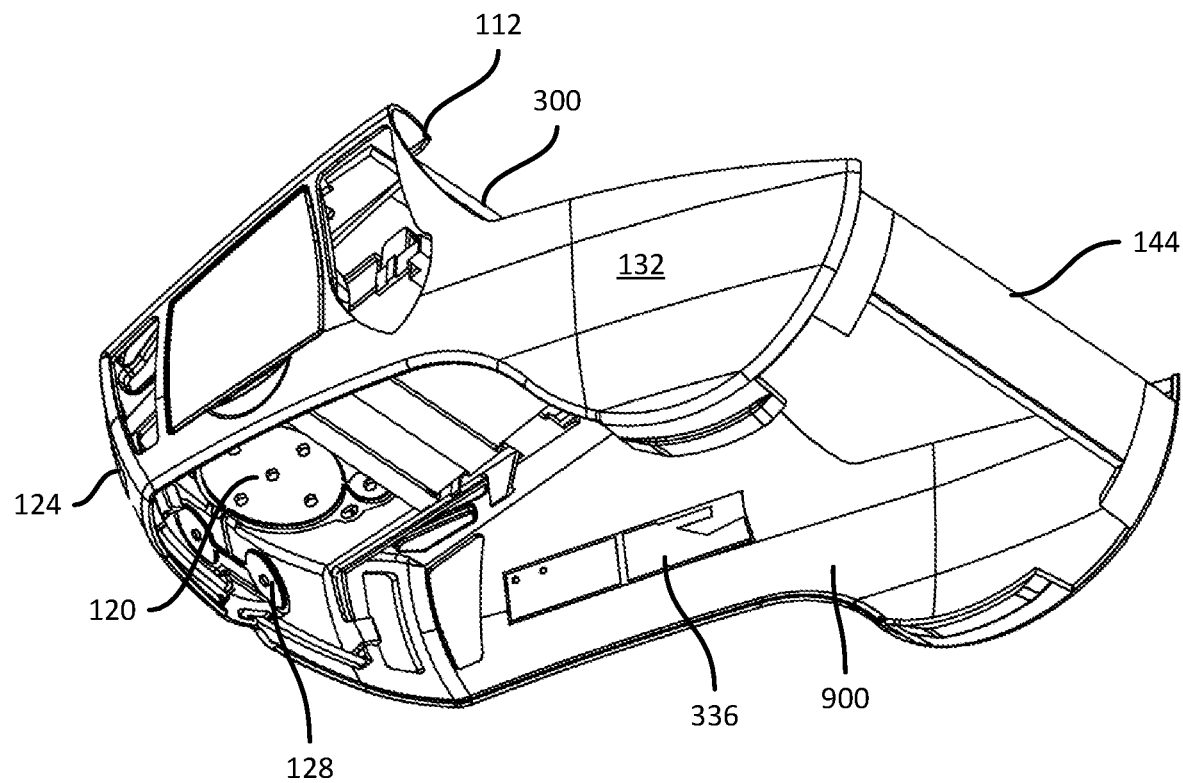
FIG. 9 is a diagram of an interior of a portion of a housing of the further media processing device.

The positions of mounting surfaces and the antennas 328, 332, and 336 as described above can also be combined in other examples. For instance, in a further example printer, the antenna 336 can be disposed on the battery well 408 as in the printer 500, while the antennas 328 and 332 are disposed as shown in connection with the printer 100. Further variations are also contemplated. Another example variation is shown in FIG. 9, in which a portion of the housing 108 is shown in isolation. In particular, the side walls 132 and 136, as well as the upper wall 112 (including the portion 300) and the end wall 124, are illustrated in isolation from the remainder of the housing 108. That is, the back wall 140, as well as the frame 404 and internal components supported on the frame 404, are omitted from FIG. 9.

While the antennas 328 and 332 can be installed as shown in FIGS. 7 and 8 in this example (or, in other examples, in a combination of the orientations shown in FIGS. 1 to 8), the antenna 336 in the example of FIG. 9 is disposed on a mounting surface that is not on the battery well 408 or the frame 404. Instead, in this example the mounting surface is defined on the side wall 136, e.g., on an inner surface 900 of the side wall 136. The mounting surface for the antenna 336 is therefore oriented into the compartment 320, although the antenna 336 can be mounted to radiate outwards, through the side wall 136. The mounting surface for the antenna 336 may therefore, in this example, be substantially parallel to the mounting surface for the antenna 332 (e.g., on the wall 700 of the battery well 408), but the mounting surfaces for the antennas 332 and 336 can be located adjacent to opposite sides of the housing 108, and the antennas 332 and 336 can radiate in substantially opposite directions.

Figure 10:
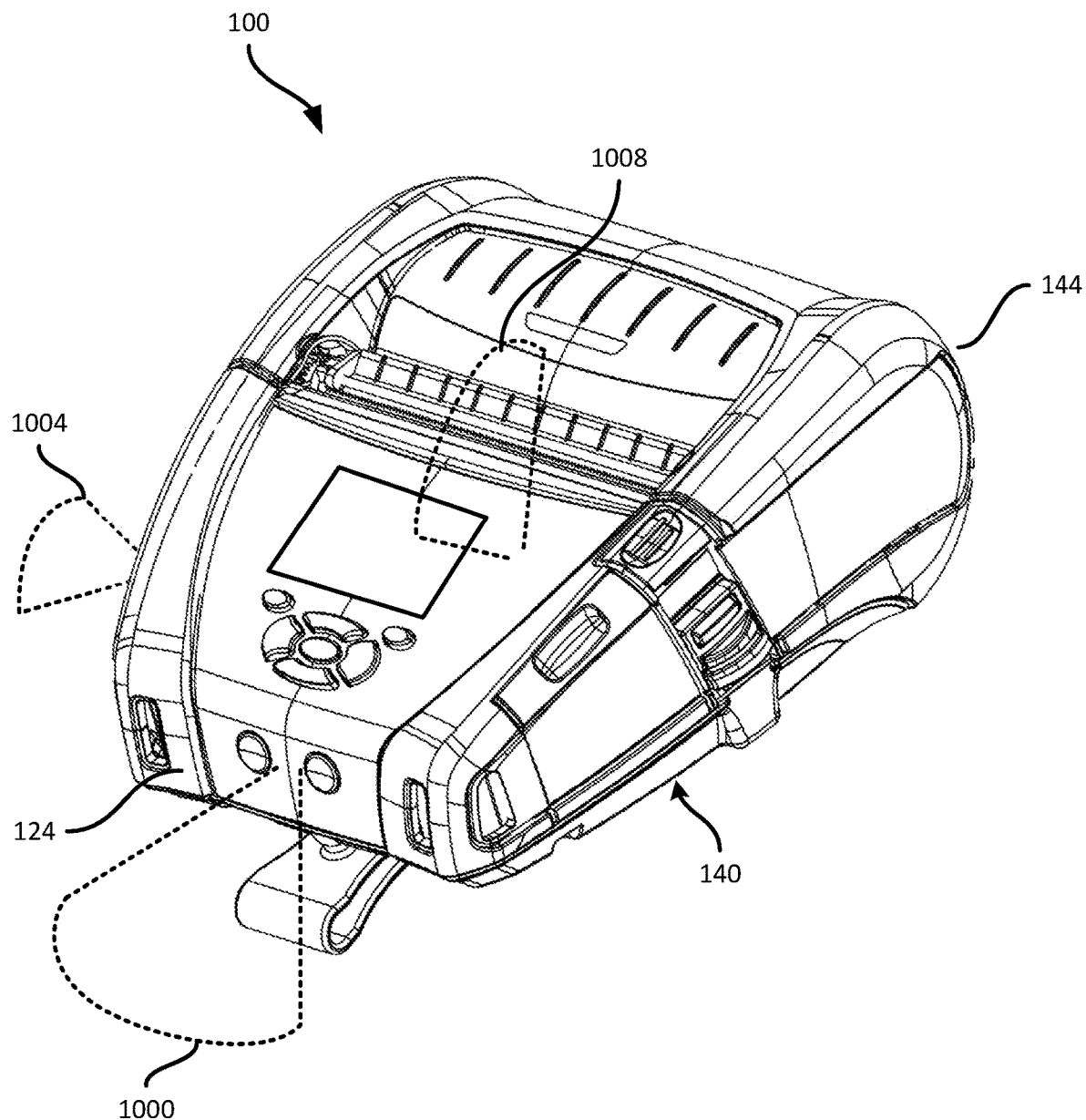
FIG. 10 is a perspective view of the media processing device of FIG. 1, illustrating radiation patterns for the antennas of the media processing device.

As will be apparent in the discussion above, the mounting surfaces implemented to support the antennas 328, 332, and 336 position the antennas to reduce or avoid radiating through components such as the display 116, the print head 314, the circuit board 412, the battery, and the like (e.g., large conductive elements that can interfere with antenna performance). Further, as shown in FIG. 10, for example, the antennas 328, 332, and 336 may avoid radiating through the back wall 140 or the end 144, as the back wall 140 may face an operator when the printer 100 is in use, and the end 144 may face the ground, floor, or the like when the printer is in use. As shown in FIG. 10, the antenna 328 can radiate in a region 1000, e.g., directed outwards from the end wall 124. The antenna 332 can radiate in a region 1004, e.g., substantially orthogonal to the region 1000, and the antenna 336 can radiate in a region 1008, which can be substantially orthogonal to the regions 1000 and 1004.

Further, installation of the antennas 328, 332, and 336 as discussed above may simplify assembly of the printers 100, 500, and the like, as the 328, 332, and 336 are not disposed on moving parts, and with the exception of the embodiment shown in FIG. 9, can be installed and connected to the controller 324 independently of the side walls 132, 136, and the front wall 112.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

Certain expressions may be employed herein to list combinations of elements. Examples of such expressions include: "at least one of A, B, and C"; "one or more of A, B, and C"; "at least one of A, B, or C"; "one or more of A, B, or C". Unless expressly indicated otherwise, the above expressions encompass any combination of A and/or B and/or C.

It will be appreciated that some embodiments may be comprised of one or more specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A media processing device, comprising:
   a housing having a plurality of walls enclosing a compartment, and defining a media supply chamber adjacent to the compartment;
   a cover movably coupled to a first end of the housing adjacent to the media supply chamber, the cover movable between a closed position to enclose the media supply chamber, and an open position to expose the media supply chamber;
   a print head configured to (i) apply indicia to media from the media supply chamber, and (ii) cooperate with the cover to form an outlet at a front wall of the housing for dispensing the media;
   a frame supported by the housing within the compartment, the frame defining (i) a first mounting surface adjacent to a second end of the housing opposite the first end, the first mounting surface oriented towards the second end, (ii) a second mounting surface, a portion of the second mounting surface orthogonal to the first mounting surface and oriented towards a side of the housing, and (iii) a third mounting surface oriented towards the front wall of the housing;
   a first antenna disposed on the first mounting surface;
   a second antenna disposed on the second mounting surface, controllable with the first antenna to implement a first communications standard; and
   a third antenna disposed on the third mounting surface, and controllable to implement a second communications standard.

2. The media processing device of claim 1, wherein the front wall defines an opening therethrough;
   wherein the media processing device further comprises a display panel supported in the opening; and
   wherein the third mounting surface faces a portion of the front wall distinct from the opening.

3. The media processing device of claim 1, further comprising a printed circuit board supported by the frame, the printed circuit board carrying at least one communications controller for controlling the first, second, and third antennas;
  wherein the third mounting surface is between the printed circuit board and the front wall.

4. The media processing device of claim 1, further comprising:
  a control input supported by the housing at the first end;
  wherein the first mounting surface is oriented towards the control input.

5. The media processing device of claim 1, wherein a further portion of the second mounting surface is substantially coplanar with the first mounting surface; and
  wherein a radiative segment of the second antenna is disposed on the portion of the second mounting surface, and a feed segment of the second antenna is disposed on the further portion of the second mounting surface.

6. The media processing device of claim 1, wherein the housing defines a battery well extending into the compartment from a back wall of the housing opposite the front wall; and
  wherein the third mounting surface is oriented away from the battery well.

7. A media processing device, comprising:
  a housing having a plurality of walls enclosing a compartment, and defining a media supply chamber adjacent to the compartment;
  a cover movably coupled to a first end of the housing adjacent to the media supply chamber, the cover movable between a closed position to enclose the media supply chamber, and an open position to expose the media supply chamber;
  a print head configured to (i) apply indicia to media from the media supply chamber, and (ii) cooperate with the cover to form an outlet at a front wall of the housing opposite the back wall, for dispensing the media;
  a frame supported by the housing within the compartment, the frame defining a first mounting surface adjacent to a second end of the housing opposite the first end, the first mounting surface oriented towards the second end;
  a plurality of secondary walls defining a battery well extending into the compartment from a back wall of the housing, the secondary walls defining (i) a second mounting surface within the compartment, orthogonal to the first mounting surface and oriented towards a side of the housing, and (ii) a third mounting surface within the compartment having a portion oriented towards the side of the housing;
  a first antenna disposed on the first mounting surface;
  a second antenna disposed on the second mounting surface, controllable with the first antenna to implement a first communications standard; and
  a third antenna disposed on the third mounting surface, and controllable to implement a second communications standard.

8. The media processing device of claim 7, wherein the portion of the third mounting surface and the second mounting surface are defined on a side wall of the secondary walls, the side wall facing the side of the housing;
  wherein a further portion of the third mounting surface wraps onto an end wall of the secondary walls; and
  wherein a radiative segment of the third antenna is disposed on the portion of the third mounting surface, and a feed segment of the third antenna is disposed on the further portion of the third mounting surface.

9. The media processing device of claim 8, wherein the end wall of the secondary walls is oriented towards the media supply chamber.

10. The media processing device of claim 7, further comprising:
  a control input supported by the housing at the first end;
  wherein the first mounting surface is oriented towards the control input.

11. A media processing device, comprising:
  a housing having a plurality of walls enclosing a compartment, and defining a media supply chamber adjacent to the compartment;
  a first side wall of the housing having an inner surface within the compartment defining a first mounting surface;
  a first antenna disposed on the first mounting surface of the side wall, the first antenna controllable to implement a first communications standard;
  a cover movably coupled to a first end of the housing adjacent to the media supply chamber, the cover movable between a closed position to enclose the media supply chamber, and an open position to expose the media supply chamber;
  a print head configured to (i) apply indicia to media from the media supply chamber, and (ii) cooperate with the cover to form an outlet at a front wall of the housing opposite the back wall, for dispensing the media;
  a frame supported by the housing within the compartment, the frame defining a second mounting surface adjacent to a second end of the housing opposite the first end, the second mounting surface oriented towards the second end;
  a second antenna disposed on the second mounting surface;
  an internal wall disposed within the compartment, the internal wall defining a third mounting surface adjacent to a second side wall of the housing, opposite the first side wall, and facing towards the second side wall; and
  a third antenna disposed on the third mounting surface, controllable with the second antenna to implement a second communications standard.

12. The media processing device of claim 11, wherein the first communications standard is a wireless personal area network standard; and
  wherein the second communications standard is a wireless local area network standard.

13. The media processing device of claim 11, further comprising:
  a control input supported by the housing at the first end;
  wherein the first mounting surface is oriented towards the control input.

14. The media processing device of claim 11, wherein the first mounting surface is substantially parallel to the second mounting surface.

15. The media processing device of claim 11, further comprising a battery well extending into the compartment; wherein the internal wall forms a portion of the battery well.

* * * * *